United States Patent
Im

(10) Patent No.: US 8,426,296 B2
(45) Date of Patent: Apr. 23, 2013

(54) SYSTEMS AND METHODS FOR PREPARING EPITAXIALLY TEXTURED POLYCRYSTALLINE FILMS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/219,960

(22) Filed: Aug. 29, 2011

(65) Prior Publication Data

US 2012/0045191 A1  Feb. 23, 2012

Related U.S. Application Data

(62) Division of application No. 12/275,720, filed on Nov. 21, 2008, now Pat. No. 8,012,861.

(60) Provisional application No. 60/989,719, filed on Nov. 21, 2007.

(51) Int. Cl.
*H01L 21/20* (2006.01)

(52) U.S. Cl.
USPC ........... 438/487; 438/150; 438/166; 438/478; 438/486; 438/496; 257/E21.413

(58) Field of Classification Search .................. None
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,653,903 A | 3/1987 | Torigoe et al. | |
| 4,691,983 A | 9/1987 | Kobayashi et al. | |

(Continued)

FOREIGN PATENT DOCUMENTS

| CN | 1495848 A | 5/2004 |
|---|---|---|
| CN | 101111925 A | 1/2008 |

(Continued)

OTHER PUBLICATIONS

Andrä et al., "A new technology for crystalline silicon thin film solar cells on glass based on the laser crystallization," IEEE, pp. 217-220 (2000).

(Continued)

*Primary Examiner* — Kyoung Lee
(74) *Attorney, Agent, or Firm* — Wilmer Cutler Pickering Hale & Dorr LLP

(57) ABSTRACT

The disclosed subject matter relates to systems and methods for preparing epitaxially textured polycrystalline films. In one or more embodiments, the method for making a textured thin film includes providing a precursor film on a substrate, the film includes crystal grains having a surface texture and a non-uniform degree of texture throughout the thickness of the film, wherein at least a portion of the this substrate is transparent to laser irradiation; and irradiating the textured precursor film through the substrate using a pulsed laser crystallization technique at least partially melt the film wherein the irradiated film crystallizes upon cooling to form crystal grains having a uniform degree of texture.

8 Claims, 6 Drawing Sheets

U.S. PATENT DOCUMENTS

| | | |
|---|---|---|
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,663,579 A | 9/1997 | Noguchi |
| 5,683,935 A | 11/1997 | Miyamoto et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,948,172 A | 9/1999 | Neiheisel |
| 5,948,291 A | 9/1999 | Neylan et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,224 A | 2/2000 | Shimogaichi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,135,632 A | 10/2000 | Flint |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,184,490 B1 | 2/2001 | Schweizer |
| 6,187,088 B1 | 2/2001 | Okumura et al. |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,387,178 B1 | 5/2002 | Geho et al. |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,860,939 B2 | 3/2005 | Hartzell |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |

| | | |
|---|---|---|
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2 | 1/2007 | Im et al. |
| 7,164,152 B2 | 1/2007 | Im |
| 7,172,952 B2 | 2/2007 | Chung |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2 | 5/2007 | Im et al. |
| 7,297,982 B2 | 11/2007 | Suzuki et al. |
| 7,311,778 B2 | 12/2007 | Im et al. |
| 7,318,866 B2 | 1/2008 | Im |
| 7,323,368 B2 | 1/2008 | Takayama et al. |
| 7,326,876 B2 | 2/2008 | Jung |
| 7,364,952 B2 | 4/2008 | Im |
| 7,399,359 B2 | 7/2008 | Im et al. |
| 7,622,370 B2 | 11/2009 | Im |
| 7,629,234 B2 | 12/2009 | Bruland |
| 7,645,337 B2 | 1/2010 | Im et al. |
| 7,691,687 B2 | 4/2010 | Im |
| 7,700,462 B2 | 4/2010 | Tanaka et al. |
| 7,709,378 B2 | 5/2010 | Im |
| 7,804,647 B2 | 9/2010 | Mitani et al. |
| 7,964,480 B2 | 6/2011 | Im et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0179004 A1 | 12/2002 | Jung |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1* | 1/2003 | Taketomi et al. ............. 438/496 |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara et al. |
| 2003/0119286 A1 | 6/2003 | Im et al. |
| 2003/0139069 A1 | 7/2003 | Block et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1* | 1/2005 | Takaoka et al. ............... 438/151 |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1 | 3/2005 | Im |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1* | 10/2005 | Im et al. ............................ 117/4 |
| 2005/0236908 A1 | 10/2005 | Rivin |
| 2005/0255640 A1 | 11/2005 | Im et al. |
| 2005/0282319 A1 | 12/2005 | Bruland et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0137105 A1 | 5/2009 | Im |
| 2009/0140173 A1 | 6/2009 | Im |
| 2009/0218577 A1 | 9/2009 | Im |
| 2009/0242805 A1 | 10/2009 | Im |
| 2009/0309104 A1 | 12/2009 | Im et al. |
| 2010/0024865 A1 | 2/2010 | Shah et al. |
| 2010/0187529 A1 | 7/2010 | Im |
| 2011/0248278 A1 | 10/2011 | Im et al. |
| 2011/0309370 A1 | 12/2011 | Im |

FOREIGN PATENT DOCUMENTS

| | | |
|---|---|---|
| DE | 19839718 | 3/2000 |
| DE | 10103 670 A1 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |

| | | |
|---|---|---|
| JP | H10-244390 | 9/1998 |
| JP | 11025064 A | 1/1999 |
| JP | 11064883 A | 3/1999 |
| JP | 11-281997 | 10/1999 |
| JP | H11-297852 | 10/1999 |
| JP | 11330000 A | 11/1999 |
| JP | 2000505241 A | 4/2000 |
| JP | 2000-315652 | 11/2000 |
| JP | 2000346618 | 12/2000 |
| JP | 2001023920 A | 1/2001 |
| JP | 2002-203809 | 7/2002 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 2003-509844 | 3/2003 |
| JP | 20003100653 | 4/2003 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2000 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-0231869 A2 | 4/2002 |
| WO | WO-02/42847 | 5/2002 |
| WO | WO-02/086954 A1 | 10/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017380 | 2/2004 |
| WO | WO-2004/017381 | 2/2004 |
| WO | WO-2004/017382 A3 | 4/2004 |
| WO | WO-2004/075263 A3 | 1/2005 |
| WO | WO-2005/029551 | 3/2005 |
| WO | WO-2005/054949 A2 | 6/2005 |
| WO | WO-2005/029550 A3 | 9/2005 |
| WO | WO-2004/017379 A3 | 12/2005 |
| WO | WO-2006/055003 A1 | 5/2006 |
| WO | WO-2005/029548 A3 | 4/2009 |
| WO | WO-2005/029546 A3 | 6/2009 |

OTHER PUBLICATIONS

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.
Bergmann, R. et al., Nucleation and Growth of Crystalline Silicon Films on Glass for Solar Cells, Phys. Stat. Sol., 1998, pp. 587-602, vol. 166, Germany.
Biegelsen, D.K., L.E. Fennell and J.C. Zesch, Origin of oriented crystal growth of radiantly melted silicon on SiO/sub 2, Appl. Phys. Lett. 45, 546-548 (1984).
Boyd, I. W., "Laser Processing of Thin Films and Microstructures, Oxidation, Deposition and Etching of Insulators," (Springer—Verlag Berlin Heidelber, 1987.
Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).
Brotherton at al., "Influence of Melt Depth in Laser Crystallized Poly-Si Thin Film Transistors," Journal of Appl. Phys., 82:4086-4094 (1997).
Brotherton, "Polycrystalline Silicon Thin Film Transistors," Semicond. Sci. Tech., 10:721-738 (1995).
International Search Report and Written Opinion issued for corresponding International Patent Application No. PCT/US2008/084389.

Crowder et al., "Low-Temperature Single-Crystal Si TFT's Fabricated on Si Films Processed via Sequential Lateral Solidification," IEEE Electron Device Letter, 19 (8): 306-308 (1998).
Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9. 7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland. (1999).
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A. et al., "Effect of pressure on the growth of crystallites of low-pressure chemical-vapor-deposited polycrystalline silicon films and the effective electron mobility under high normal field in thin-film transistors," J. Appl. Phys. 73 (12), Jun. 15, 1993, 8402-8411.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Endert et al., "Excimer Laser: A New Tool for Precision Micromachining," Optical and Quantum Electronics, 27:1319-1335 (1995).
Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of SI Films with a moveable-ship heater oven," J. Electro-Chem. Soc., 129: 2812-2818 (1982).
Gosain et al., "Formation of (100)-Textured Si Film Using an Excimer Laser on a Glass Substrate," Jpn. J. Appl. Phys., vol. 42 (2003) pp. L135-L137.
Gupta et al., "Numerical Analysis of Excimer-laser induced melting and solidification of Si Thin Films", Applied Phys. Lett., 71:99-101, 1997.
Hau-Riege et al., "The Effects Microstructural Transitions at Width Transitions on interconnect reliability," Journal of Applied Physics, 87(12): 8467-8472 (Jun. 15, 2000).
Hawkins, W.G. et al., "Origin of lamellae in radiatively melted silicon flims," Appl. Phys. Lett. 42(4), pp. 358-360, Feb. 15, 1983.
Hayzelden, C. and J.L. Batstone, Silicide formation and silicide-mediated crystallization of nickel-implanted amorphous silicon thin films, J. Appl. Phys. 73, 8279-8289 (1993).
Im et al., "Controlled Super-Lateral Growth of Si Films for Microstructure! Manipulation and Optimization," Phys. Stat. Sol. (a), 166:603-617 (1998).
Im et al., "Crystalline Si Films for Integrated Active-Matrix Liquid-Crystals Displays," MRS Bulletin, 21:39-48 (1996).
Im et al., "On the Super Lateral Growth Phenomenon Observed in Excimer Laser-Induced Crystallization of Thin Si Films," Appl. Phys. Lett., 64 (17): 2303-2305 (1994).
Im et al., "Phase Transformation Mechanisms Involved in Excimer Laser Crystallization of Amorphous Silicon Films," Appl. Phys. Lett., 63 (14): 1969-1971 (1993).
Im et al., "Single-Crystal Si Films for Thin-Film Transistor Devices," Appl. Phys. Lett., 70(25): 3434-3436 (1997).

Ishida et al., "Ultra-shallow boxlike profiles fabricated by pulsed ultraviolet-laser doping process," J. Vac. Sci. Technol. B 12(1): 399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "New Excimer Laser Recrystallization of Poly-Si for Effective Grain Growth and Grain Boundary Arrangement," Jpn. J. Appl. Phys. vol. 39 (2000) pp. 2012-2014, Part 1, No. 4B, Apr. 2000.

Jeon et al., "Two-step laser recrystallization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misodentation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, pp. 903-908 (1995).

Kim et al., "Multiple Pulse Irradiation Effects in Excimer Laser-Induced Crystallization of Amorphous Si Films," Mat. Res. Soc. Sym. Proc., 321:665-670 (1994).

Kim, "Excimer-Laser-Induced Crystallization of Amorphous Silicon Thin Films," Ph. D. Dissertation Abstract, Columbia University, 1996.

Kim, C. at al., "Development of SLS-Based SOG Display," IDMC 2005, pp. 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, pp. 703-708 (1993).

Kim, H.-J., et al., "The effects of dopants on surface-energy-driven secondary grain growth in silicon films," J. Appl. Phys. 67 (2), pp. 757-767 (Jan. 15, 1990).

Kimura, M. and K. Egami, Influence of as-deposited film structure on (100) texture in laser-recrystallized silicon on fused quartz, Appl. Phys. Lett. 44, 420-422 (1984).

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422-2428 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683-685 (1985).

Kuriyama, H., T. Nohda, S. lshida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190-6195 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657-5662 (1994).

Lee, S.-W. and S.-K. Joo, Low temperature poly-Si thin-film transistor fabrication by metal-induced lateral crystallization, IEEE Electron Device Letters 17, 160-162 (1996).

Lee, S.-W., Y.-C. Jeon and S.-K. Joo, Pd induced lateral crystallization of amorphous Si thin films, Appl. Phys. Lett. 66, 1671-1673 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).

MICRO/LAS Lasersystem Gmbh, "Overview of Beam Delivery Systems for Excimer Lasers," (1999). 20 pages.

MICRO/LAS Lasersystem Gmbh, "UV Optics Systems for Excimer Laser Based Micromachining and Marking," (1999). 11 pages.

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944-946 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA, pp. 117-128 (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Sinke et al., "Explosive crystallization of amorphous silicon: Triggering and propagation," Applied Surface Science, vol. 43, pp. 128-135 (1989).

Smith, H.I. et at "The Mechanism of Orientation in Si Graphoepitaxy by Laser Strip Heater Recrystallization," J. Electrochem. Soc.: Solid-State Science and Technology, vol. 130, No. 10, 1983, pp. 2050-2053.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

van der Wilt, P.C. et al., "State-of-the-Art Laser Crystallization of Si for Flat Panel Displays," PhAST, May 18, 2004, pp. 1-34.

van der Wilt, P.C. at al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Watanabe at al., "Crystallization Process of Polycrystalline Silicon by KrF Excimer Laser Annealing," Japanese J. Of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Van Der Wilt, "A hybrid approach for obtaining orientation-controlled single-crystal Si regions on glass substrates," Proc. of SPIE vol. 6106, 61060B-1 to B-15, (2006).

International Search Report for corresponding International Patent Application No. PCT/US2010/033565, mailed Jul. 1, 2010, 1 page.

International Search Report for corresponding International Patent Application No. PCT/US2010/055106, mailed Jan. 4, 2011, 1 page.

Brotherton, S.D., et al., Characterisation of poly-Si TFTs in Directionally Solidified SLS Si, Asia Display/IDW'01, p. 387-390, 2001.

Im, J.S., Method and system for producing crystalline thin films with a uniform crystalline orientation, U.S. Appl. No. 60/503,419; ref. file No. 36013(BB); Columbia ref. M02-063, filed Sep. 16, 2003.

Kim, H.J. et al., "New Excimer-laser-crystallization method for producing large-grained and grain boundary-location-controlled Si Films for Thin Film Transistors", Applied Phys. Lett., Mar. 11, 1996, vol. 68, No. 11, pp. 1513-1515.

Knowles, D.S. et al., "P-59: Thin Beam Crystallization Method: a New Laser Annealing Tool with Lower Cost and Higher Yield for LTPS Panels," SID 00 Digest, pp. 1-3, 2000.

* cited by examiner

SYSTEMS AND METHODS FOR PREPARING EPITAXIALLY TEXTURED POLYCRYSTALLINE FILMS

CROSS REFERENCE TO RELATED APPLICATION

This application is a divisional of and claims priority under 35 U.S.C. §121 to U.S. Utility application Ser. No. 12/275,720 (to be issued as U.S. Pat. No. 8,012,861 on Sep. 6, 2011), filed on Nov. 21, 2008 entitled "Systems and Methods for Preparing Epitaxially Textured Polycrystalline Films," which claims priority under 35 U.S.C. §119(e) to U.S. Provisional Application Ser. No. 60/989,719, filed on Nov. 21, 2007 entitled "Methods and Systems for Backside Laser Crystallization of Textured Polycrystalline Film," and the disclosure of which is hereby incorporated by reference in their entirety.

This application is related to commonly owned and co-pending application filed on even date herewith and entitled "Systems and Methods for Preparation of Epitaxially Textured Thick Films," the contents of which are incorporated by reference in its entirety, which claims priority to U.S. Provisional Application Ser. No. 61/012,229, filed on Dec. 7, 2007, entitled "Methods And Systems for Backside Laser Induced Epitaxial Growth of Thick Film," the contents of which are incorporated by reference in its entirety.

All patents, patent applications and patent publications cited herein are hereby incorporated by reference in their entirety.

BACKGROUND

The technology described herein relates to systems and methods for preparing epitaxially textured polycrystalline films.

In recent years, various laser crystallization techniques for crystallizing or improving the crystallinity of an amorphous or polycrystalline semiconductor film have been investigated. Laser crystallization has been used in the manufacture of a variety of devices, such as image sensors and displays, for example, active-matrix liquid-crystal display (AMLCD) devices. In the latter, a regular array of thin-film transistors (TFTs) are fabricated on an appropriate transparent substrate and each transistor serves as a pixel controller. Large grain polycrystalline thin-films also have been used as seed layers for polycrystalline thick-film solar cells.

Laser-induced crystalline growth in thin film semiconductors, while improving location and size of the crystalline structure, can nonetheless lead to a material with an intragrain defect density that is unacceptably high for certain microelectronics and solar cell applications. Depending on experimental conditions, including the growth velocity, film thickness and details of the irradiation, the defects can range anywhere from closely spaced stacking faults or twin boundaries, to widely spaced sub-boundaries, e.g., several µm apart In addition, the crystal orientation of the seed can influence defect formation. For example, in pulsed-laser irradiation experiments, it is commonly found that {111} and in particular {100} surface orientations typically can lead to a minimally defective material, and other orientations, such as {110} or {112} can lead to defective growth in one or more lateral growth directions. Conventional methods of obtaining a surface-oriented film (also referred to as a textured film) are known, including zone melt recrystallization (ZMR), solid phase recrystallization, direct deposition techniques (including, chemical vapor deposition (CVD) sputtering, and evaporation), surface-energy-driven secondary grain growth (SEDSGG) and pulsed laser crystallization (SLS, multiple-pulse excimer laser annealing (ELA)) methods.

SUMMARY

The disclosed subject matter relates to systems and methods for preparing epitaxially textured polycrystalline films.

In one or more embodiments, the disclosed subject matter relates to providing a precursor film on a substrate, the film includes crystal grains having a surface texture and a non-uniform degree of texture throughout the thickness of the film, wherein at least a portion of the this substrate is substantially transparent to laser irradiation; and irradiating the textured precursor film through the substrate using a pulsed laser crystallization technique to at least partially melt the film wherein the irradiated film crystallizes upon cooling to form crystal grains having a uniform degree of texture.

In one or more embodiments, said pulsed laser crystallization technique comprises flood irradiation to partially melt the film leaving a thin portion of the film solid at the surface of the film, wherein the thin portion consists predominantly of crystal grains having a crystallographic orientation predominantly in one direction.

In one or more embodiments, said pulsed laser crystallization technique includes sequential lateral solidification wherein a portion of the crystal grains having a crystallographic orientation predominantly in one direction are completely melted and the melted portion laterally crystallizes on said crystallographically oriented crystals.

In one or more embodiments, sequential lateral solidification crystallization includes generating a plurality of laser beam pulses, irradiating a selected region of a film with one of the plurality of laser beam pulses, said beam having an intensity that is sufficient to melt the irradiated portion of the film, wherein the irradiated portion of the film crystallizes upon cooling into a crystallographic orientation predominantly in one direction, and irradiating successive portions of the selected region with the pulsed laser beams, to substantially crystallize the selected region of the film.

In one or more embodiments, the method includes directing the plurality of laser beam pulses through a mask to generate a plurality of patterned laser beams.

In one or more embodiments, the mask includes a dot-patterned mask.

In one or more embodiments, the mask includes opaque array patterns which include at least one of dot-shaped areas, hexagonal-shaped areas and rectangular-shaped areas.

In one or more embodiments, the textured film is generated by the direct deposition methods.

In one or more embodiments, the direct deposition methods include one of chemical vapor deposition, sputtering and evaporation.

In one or more embodiments, the pulsed laser crystallization methods include one of sequential lateral solidification and multiple-pulse excimer laser annealing processes.

In one or more embodiments, the predominant crystallographic orientation is a {111} orientation.

In one or more embodiments, the predominant crystallographic orientation is a {100} orientation.

In one or more embodiments, a system for processing a film on a substrate, includes at least one laser for generating a plurality of laser beam pulses, a film support for positioning the film that is capable of movement in at least one direction, at least a portion of said film support transparent to laser irradiation, a mask support, optics for directing a first set of laser beam pulses through a first mask and through the transparent portion of the film support to generate a film having a uniform high degree of texture throughout the thickness of the film and a controller for controlling the movement of the film support in conjunction with frequency of the first set of and second set of laser beam pulses.

In one or more embodiments, the system includes a mask support.

In one or more embodiments, the textured film is generated by direct deposition methods.

In one or more embodiments, the direct deposition methods include one of chemical vapor deposition, sputtering, and evaporation.

In one or more embodiments, the pulsed laser crystallization methods include one of sequential lateral solidification and multiple-pulse excimer laser annealing processes.

In one or more embodiments, a system for processing a film on a substrate includes a substrate, wherein at least a portion of the this substrate is transparent to laser irradiation, a precursor film on a substrate including crystal grains having a non-uniform degree of texture throughout the thickness of the film, and means for irradiating the textured precursor film from the back side of the film using a pulsed laser crystallization technique to re-orient the crystal grains to create a thin film having a uniform high degree of texture throughout the thin film.

In one or more embodiments, said pulsed laser crystallization technique includes flood irradiation wherein the crystal grains having a crystallographic orientation predominantly in one direction are not completely melted.

In one or more embodiments, said pulsed laser crystallization technique includes sequential lateral solidification wherein a portion of the crystal grains having a crystallographic orientation predominantly in one direction are completely melted and the melted portion laterally crystallizes on said crystallographically oriented crystals.

In one aspect, a method for making a textured thin film includes providing a textured precursor film comprising crystal grains having a crystallographic orientation predominantly in one direction on a substrate, wherein at least a portion of the substrate is transparent to laser irradiation; and irradiating the textured precursor film from the back side of the film using a pulsed laser crystallization technique, wherein crystal grains oriented in said crystallographic orientation are grown on said crystallographically oriented crystals.

BRIEF DESCRIPTION OF THE DRAWING

The foregoing and other features and advantages of certain embodiments described herein will be apparent from the following more particular description, as illustrated in the accompanying drawings.

DETAILED DESCRIPTION

The disclosed subject matter relates to a method for creating a thin film which has a uniform degree of texture and in some preferred embodiments also a uniform microstructure. This is accomplished by irradiating a deposited textured thin film from the back side of the film prior to generating the required texture throughout the film, followed by optional crystallization of the film using a crystallization technique that preserves the texture of the film, e.g., sequential lateral solidification ("SLS").

Figure 4:
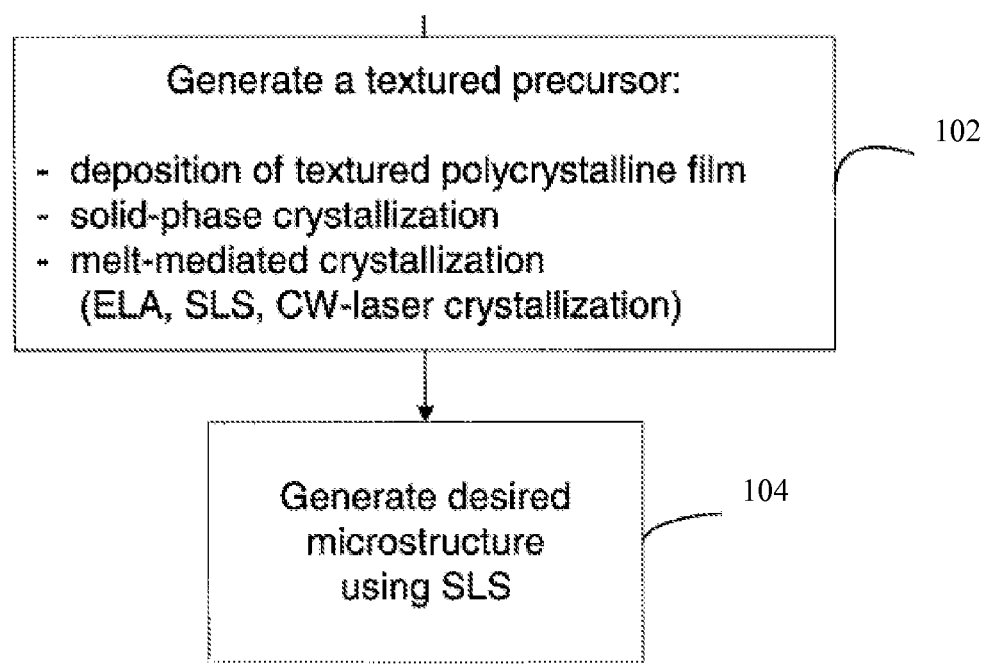
FIG. 4 is an illustrative schematic of a hybrid sequential lateral solidification (SLS) method in accordance with the prior art.

As shown in FIG. 4, previous methods of creating textured thin films involved two steps: (1) generating a textured precursor (102) and (2) generating the desired microstructure using SLS (104). This is method is referred to herein as "hybrid SLS."

Figure 5:
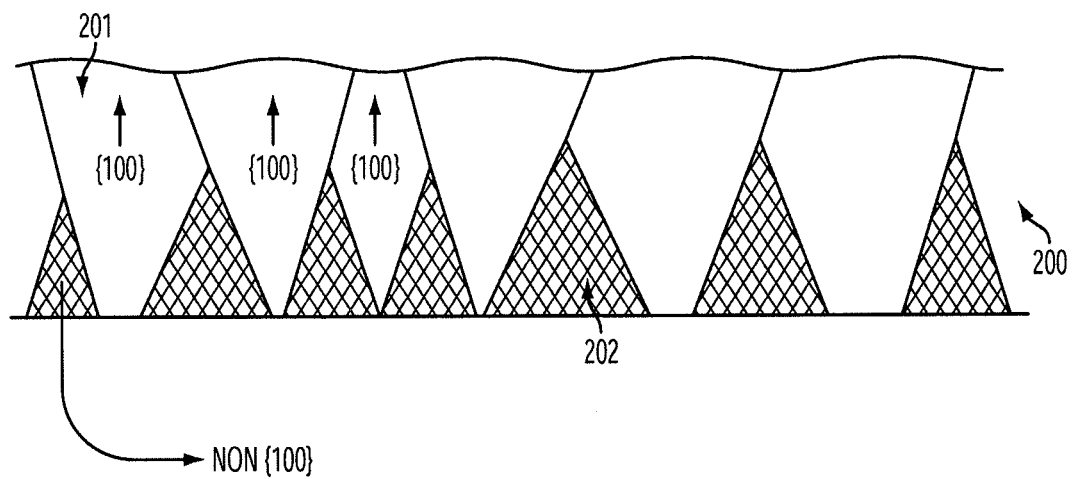
FIG. 5 is a schematic illustration of a conventional textured film in which texture quality varies throughout the film and has the highest degree of texture at the top surface of the film.

Textured films can generally be generated either directly through deposition, or involving a post-deposition crystallization procedure. While various crystallization procedures have been demonstrated to result in highly textured films, doing so requires an additional processing step commonly involving equipment that is distinct from the equipment that is used for creating the uniform microstructure. The use of textured films obtained via deposition would thus be preferable, as it combines the deposition and texturing processes and thereby eliminates a processing step. However, thin films created using deposition methods do not typically have a uniform degree of texture throughout the thickness of the film. For example, as shown in FIG. 5, after deposition of the thin film 200 on a substrate according to step 102 in FIG. 4, most deposited films have a high degree of texture towards the top of the film 201, e.g., at or near to the upper surface of the film, but have a low degree of texture towards the bottom of the film 202, e.g. at or near the substrate-film interface. Thus, the film shown in FIG. 5 has a non-uniform degree of texture throughout the thickness of the film. Because of heat absorption and heat-flow considerations, pulsed-laser crystallization processes typically are seeded from material that is at or near the bottom of the film, i.e., at or near the interface of the film with the underlying substrate. Therefore when SLS is performed on the "textured" thin film to create the desired microstructure (as shown in step 104 of FIG. 4), the lateral solidification process is initiated from a seed grain that is located at or near the bottom of the film 202 and the ensuing growth from the seed grain propagates laterally and throughout the thickness of the remainder of the completely molten area of the film. As stated above, in this region the film has low texture and, as such, the laterally grown grains will likely have low texture as well.

Figure 1A:
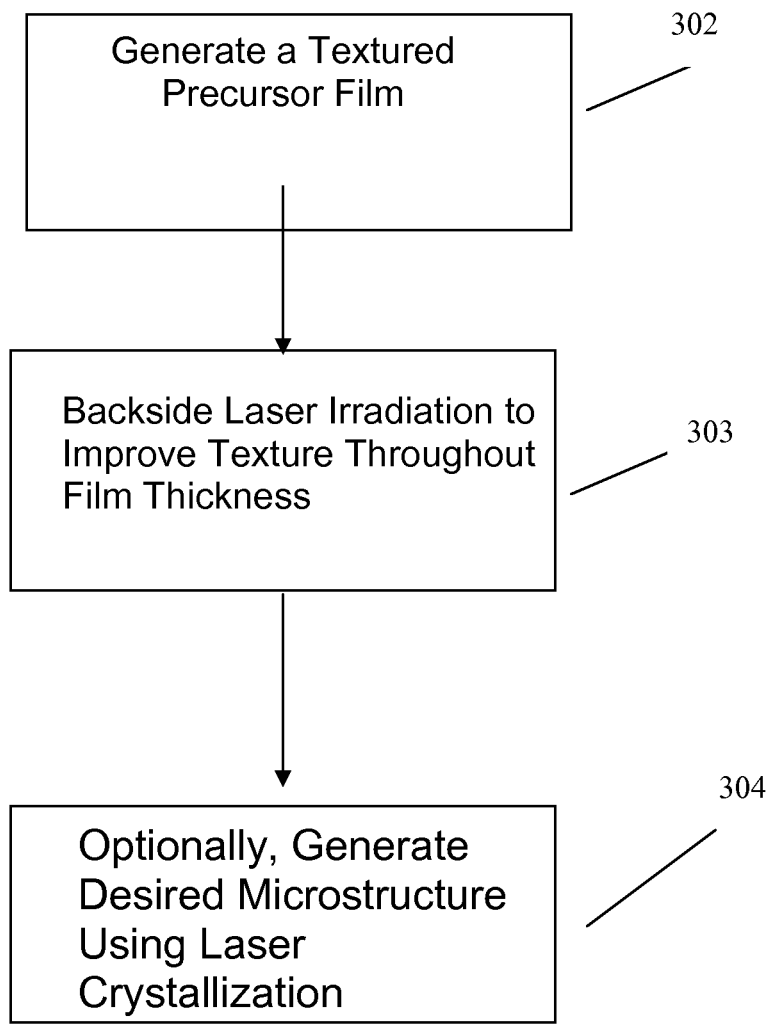
FIG. 1A is an illustrative schematic of a back side laser irradiation method in accordance with one or more embodiments described herein.

As shown in FIG. 1A, in order to create a thin film from a deposited textured precursor with both a uniform high degree of texture and a good microstructure, the film may be pre-treated before the microstructure controlling step or the microstructure may be controlled in an alternative way. After generation of a textured precursor film (302), the film is either treated with back side laser irradiation (303) to improve texture throughout the film thickness before optionally generating a desired crystalline microstructure using laser crystallization (304), or it is treated with back side laser crystallization to induce controlled lateral growth to directly impose a desired microstructure in a way that preserves and expands the texture. The method disclosed in FIG. 1A is discussed in more detail below.

In 302 of the method described in FIG. 1A, a film precursor having a non-uniform degree of texture through the thickness of the film is produced or provided through deposition. A textured deposited film contains grains having predominantly the same crystallographic orientation in at least a single direction. For example, if one crystallographic axis of most crystallites in a thin polycrystalline film is oriented preferentially in a given direction or along a selected axis, we refer to the microstructure as having "uni-axial texture." For some embodiments described herein, the preferential direction of the uni-axial texture is a direction normal to the surface of the crystallites (or the top surface of the film). Thus, "texture" can refer to a uni-axial surface texture of the grains as used herein. The degree of texture can vary depending upon the particular application for the film. The "degree" of texture refers to the volume or percent of crystalline that are substantially oriented on the given direction. Films having at least 80%, or at least 90% of their surface oriented to within 20 degrees or within 10 degrees or within 5 degrees of the selected axis are considered to be highly surface textured. For example, a higher degree of texture may be preferable for a thin film transistor (TFT) being used for a driver circuit as opposed to a TFT that is used for a switch circuit. In addition, a high degree of texture may be desired in a thin film seed layer used to epitaxially grow a thick silicon layer for solar applications.

In some instances, a textured film is obtained using conventional film deposition methods, but it was observed that the degree of the texturing varied throughout the thickness of the film. Notably, the thin film can have a differential in crystal texture between the upper and lower portions of the film. For example, the thin film can have a poorer texture at the lower region of the film that is closest to the substrate.

The thin film can be a metal or semiconductor film, with a thickness between about 50 nm to about 100 nm. The metals can include aluminum, copper, nickel, titanium, gold, and molybdenum. The semiconductor films can include conventional semiconductor materials, such as silicon, germanium, and silicon-germanium. Additional layers situated beneath or above the metal or semiconductor film are contemplated. The additional layers can be made of silicon oxide, silicon nitride and/or mixtures of oxide, nitride or other materials that are suitable, for example, for use as a thermal insulator to protect the substrate from overheating or as a diffusion barrier to inhibit diffusion of impurities from the substrate to the film. For the purposes of clarity, the laser technique is described with reference to silicon; however, it is apparent to those of skill in the art that the film can be a material susceptible to melt recrystallization.

Conventional methods of obtaining a precursor film are used in FIG. 1A (301), including direct deposition techniques (including chemical vapor deposition (CVD), sputtering, evaporation), Other methods for producing {100} textured films include CVD and low-pressure CVD. See, e.g., *J. Electrochem. Soc.* Vol. 134, NO. 134, pp. 2541-2545 (October, 1987); *J. Appl. Phys.*, Vol. 73, No. 12, pp. 8402-8411 (June, 1993); and *J. Matl. Sci. Lett.*, Vol. 7, pp. 247-250 (1988). It is envisioned that other texture-inducing methods can also be used in a similar way to generate the textured precursors. As noted above, such texturing techniques typically result in the highest degree of texture on the top surface of the film.

The deposited textured precursor film is supported on a substrate that is transparent to laser energy over at least a portion of its area. By 'transparent to laser energy', it is meant that laser energy used in the treatment of the films described herein is not substantially absorbed by the substrate (e.g., the thickness of the substrate is significantly less than the absorption length therein). Thus, laser energy is selectively absorbed by the film, with concomitant heating and melting of at least a portion of the film. Optionally, a capping layer can be used on the upper surface of the thin film to be crystallized. The capping layer can be made of a material, in particular, it can be made using materials that are inert to the textured precursor film (i.e., materials that do not interact or react with the textured precursor film), are thermally stable and/or can be readily removed after completion of the crystallization process, e.g., using hydrogen fluoride ("HF") removal. Inorganic materials such as silicon oxynitride and silicon nitride are suitable for use as capping materials. Conventional capping materials and deposition and removal techniques can be used in this process. The use of capping layers can avoid complications arising from reductions in the film's integrity during the irradiation process. For example, uring irradiation, the film can become discontinuous due to fluid flow, i.e., melting.

It has been observed that both capped and uncapped thin films can remain intact during back side irradiation procedures. The film stays largely intact even in the absence of a cap layer during irradiation. It is speculated that in uncapped samples, a thin native oxide layer can form or exist that is sufficiently strong and/or robust to support the film during laser-induced melting. In some other embodiments, the capping layer can serve as a supersubstrate that serves to reverse the direction of heat flow in the film away from the substrate, which can further help equalize the texture gradient as is discussed in greater detail below.

Formation of textured films has been previously described in an application by James Im, U.S. Ser. No. 10/994,205, filed Nov. 18, 2004 and entitled "System and Methods for Creating Crystallographic Controlled Orientation Controlled PolySilicon Films," the contents of which are incorporated herein in its entirety by reference. In that process, a film was pretreated to introduce a desired texture into the film and then crystallized using SLS laser irradiation to form the enhanced crystal growth that is typical of SLS.

However, a film that is deposited according to conventional methods, does not have a uniform degree of texture, and further lacks a uniform microstructure, i.e., the grains are randomly located on the surface and are of no particular size. As shown in FIG. 1A, the next step of the method, back side irradiation (Step 303), creates the uniform degree of texture throughout the thickness of the thin film. The laser therefore first passes through the substrate (or a transparent portion of the substrate) before entering the thin film. Back side irradiation takes advantage of the location of the higher texture quality generated at the top surface of the film. During back side irradiation, heat-flow considerations suggest that the lateral growth will proceed form the top side of the film, which will have the highest degree of texture.

Figure 2:
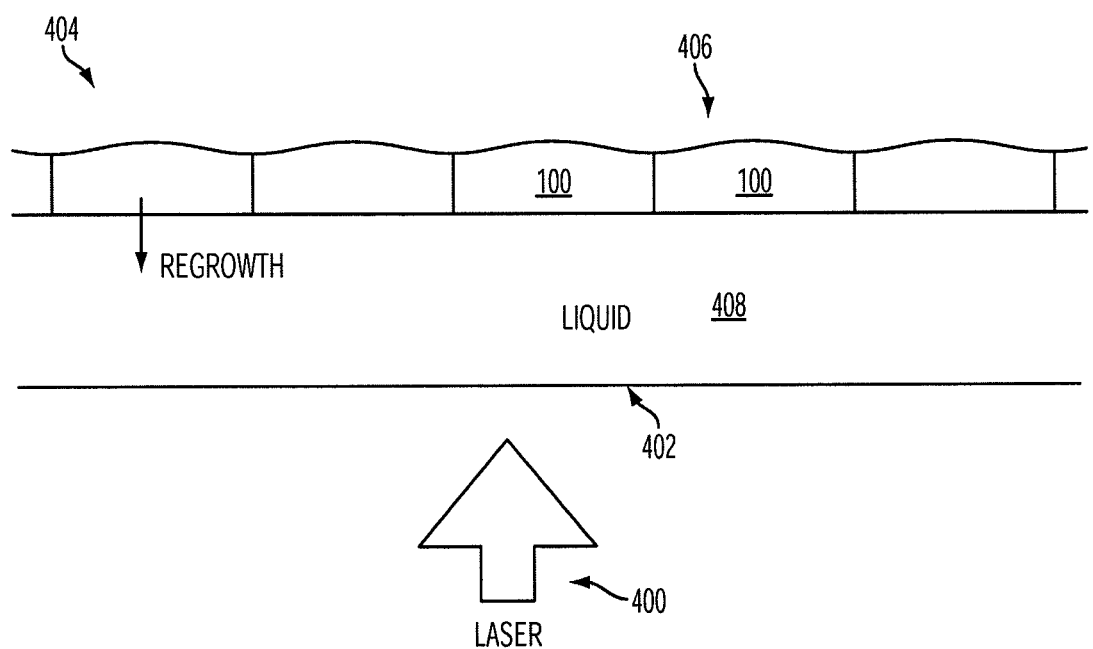
FIG. 2 is a schematic illustration of a back side laser irradiation process in accordance with one or more embodiments described herein.

FIG. 2 is a schematic illustration of a method of back side irradiation in one or more embodiments as substantially described herein. In FIG. 2, a laser 400 irradiates a back side 402 of a solid film 404, for example, silicon. As discussed previously, the top of the film 406 has a high degree of texture—having a uniform distribution and orientation of {100} crystals—while the back side of the film 402 has weak or no texture. The laser 400 melts the solid silicon in the film 404 to create a liquid 408. The silicon regrows from the melt with the highly textured {100} top of the film 406 serving as the seed layer for the grains. Therefore, the entire film, when cooled, has a high degree of texture, instead of just the top of the film 406.

Flood Irradiation

In one embodiment, the back side irradiation of the film can be flood irradiation. Flood Irradiation is an irradiation method in which a large area of the film, preferably larger than the heat diffusion length of the film, is irradiated with a uniform beam of light. This process can be used to induce melting in the film. Flood Irradiation is carried out from the back or the bottom side of the device through the substrate such that the lower portions of the thin film are irradiated first. As the substrate is transparent to the laser energy, it remains cool and unheated in this radiation process. The energy of the Flood Irradiation is selected to partially or nearly-completely melt the thickness of the deposited and textured film to induce regrowth of the film on the {100} oriented crystals only. Recall that the upper surfaces of the textured films are of the highest quality. Therefore, by partially and preferentially melting the lower portion of the thin film, a liquid/solid front is formed at a boundary of more highly textured material. As the molten silicon cools down and re-crystallizes from the upper surface down towards the substrate, the {100} texture will extend throughout the substrate. These films have much higher quality texture and can be used in subsequent applications, e.g., in an optional pulsed laser lateral growth process, to provide the desired large grain and grain boundary location controlled films. Then these films can be used as a textured layer in devices or other subsequent applications.

In some embodiments, the flood irradiation can be performed using systems similar to those used in the SLS process, which is discussed in more detail below. These SLS systems are described in the following patents and applications: U.S. Pat. No. 6,322,625, entitled "Crystallization Processing of Semiconductor Film Regions on a Substrate, and Devices Made Therewith," as filed on Nov. 27, 1998; U.S. Pat. No. 6,368,945, entitled "Method and System for Providing a Continuous Motion Sequential Lateral Solidification," as filed on Mar. 16, 2000; U.S. Pat. No. 6,555,449, entitled "Methods for Providing Uniform Large-Grained and Grain Boundary Location Manipulated Polycrystalline Thin Film Semiconductors Using Sequential Lateral Solidification," as filed on Sep. 3, 1999; and U.S. Pat. No. 6,573,531, entitled "Systems and Methods Using Sequential Lateral Solidification for Producing Single or Polycrystalline Silicon Thin Films at Low Temperatures," as filed on Sep. 3, 1999, and U.S. patent application Ser. No. 12/063,810, entitled "High Throughput Crystallization of Thin Films," filed on Feb. 14, 2008, the entire disclosures of each are incorporated by reference.) For example, the flood irradiation can be performed using a SLS system, but instead of front side irradating the film, the film is irradiated from the back side. Further if a mask is used in a two-dimensional projection SLS system, i.e., the beam has a two dimensional character, the mask can be removed for the flood irradiation process. In this way, an SLS system can be used to perform the flood irradiation.

Additionally, the flood irradiation can be performed using one dimensional beam in ELA mode line scan systems. Such systems are discussed in more detail in (U.S. patent application Ser. No. 11/293,655, entitled "Line Scan Sequential Lateral Solidification of Thin Films," as filed Dec. 2, 2005; U.S. patent application Ser. No. 12/063,810, entitled "High Throughput Crystallization of Thin Films," as filed on Feb. 14, 2008; and U.S. patent application Ser. No. 11/373,772, entitled "Processes and Systems for Laser Crystallization Processing of Film Regions on a Substrate Utilizing a Line-type Beam and Structures of Such Film Regions," as filed on Mar. 9, 2006, the entire disclosure of each are incorporated by reference). By operating in ELA mode, it is meant that beam need not be sharpened to create a more uniform energy density across the beam profile.

If either of the SLS or ELA systems are used, the fluence of the respective laser beams can be adjusted to be sufficient for only the partial melting of the film. Alternatively, the beam produced by SLS or ELA systems can be redirected through various types of optics to create a flood irradiation optimized beam to be delivered to the film.

Once a thin film with a uniform high degree of texture has been created, a uniform microstructure may be created in the thin film as shown in the FIG. 1A (304). This microstructure can be created using a variety of controlled lateral growth methods or methods based on such, such as SLS, that offer control of the lateral growth over a length not exceeding that at which defects may be formed for example through sub-boundary formation or twinning. The lateral crystallization using controlled lateral growth or SLS results in "location-controlled growth" of grain boundaries and elongated crystals of a desired crystallographic orientation. Location-controlled growth referred to herein is defined as the controlled location of grains and grain boundaries using particular beam patterns and masks such as, for example, dot-patterned masks.

The process of sequential lateral solidification (SLS) generally includes the following: generating a plurality of laser beam pulses; directing the plurality of laser beam pulses through a mask to generate a plurality of patterned laser beams; irradiating a portion of a selected region of a film with one of the plurality of patterned beams, the beam having an intensity that is sufficient to melt throughout the entire thickness the irradiated portion of the film, where the irradiated portion of the film laterally crystallizes upon cooling. The process further includes repositioning the film to irradiate a subsequent portion of the selected region with patterned beams, such that the subsequent position overlaps with the previously irradiated portion, permitting further lateral re-growth of the crystal grains. In one embodiment, successive portions of the selected region are irradiated such that the film is substantially crystallized in a single traversal of the patterned beams over the selected region of the film.

These SLS systems and processes are described in U.S. Pat. No. 6,322,625, entitled "Crystallization Processing of Semiconductor Film Regions on a Substrate, and Devices Made Therewith," issued Nov. 27, 2001; U.S. Pat. No. 6,368,945, entitled "Method and System for Providing a Continuous Motion Sequential Lateral Solidification Issued," issued Apr. 9, 2002; U.S. Pat. No. 6,555,449, entitled "Methods for Producing Uniform Large-Grained and Grain Boundary Location Manipulated Polycrystalline Thin Film Semiconductors Using Sequential Lateral Solidification," issued Apr. 29, 2003; and U.S. Pat. No. 6,573,531, entitled "Systems and Methods Using Sequential Lateral Solidification for Producing Single or Polycrystalline Silicon Thin Films at Low Temperatures," issued Jun. 3, 2002, issued to Dr. James Im, the entire disclosures of which are incorporated herein by reference, and which are assigned to the common assignee of the present application.

An alternate SLS method is used in different embodiments and is referred to herein as the dot-patterned SLS process. This process uses a mask incorporating a dot pattern. The dot mask is an inverted mask, where the dots correspond to masked regions and the remainder of the mask is transparent. In order to fabricate large silicon crystals, the dot pattern can be sequentially translated about the points on the sample where such crystals are desired. For example, the dot mask can be translated a short distance in the positive Y direction after a first laser pulse, a short distance in the negative X direction after a second laser pulse, and a short distance in the negative Y direction after a third laser pulse to induce the formation of large crystals. If the separation distance between dots is greater than two times the lateral growth distance, a crystalline structure where crystals separated by small grained polycrystalline silicon regions can be generated. If the separation distance is less or equal to two times the lateral growth distance so as to avoid nucleation, a crystalline structure where crystals are generated. Further details about this SLS method are described in U.S. Pat. No. 6,555,449, entitled "Methods for Producing Uniform Large-Grained and Grain Boundary Location Manipulated Polycrystalline Thin Film Semiconductors Using Sequential Lateral Solidification," as filed Sep. 3, 1999, the entire teachings of which are incorporated herein by reference.

In still other embodiments, the SLS process can employ a laser line beam that can be shaped with laser optics into a long aspected beam with or without the use of a mask to shape the laser beam. Further details about the SLS line beam method are found in A. Limanov and V. Borisov, Mat. Res. Soc. Symposium, Proc. Vol. 685E, D10.1.1 (2001); and U.S. Application Publication No. 2006/0254500, entitled Line Scan Sequential Lateral Solidification of Thin Films, published on Nov. 16, 2006, the contents of which are incorporated in their entirety by reference.

During the SLS process, the lower regions of the film crystallize first because the heating through beam absorption is typically in the top regions of the film and because they are adjacent to the substrate, which can act as a heat sink. This allows the onset of the solidification to be initiated from the lower side of the film. Thus, performing SLS on a deposited precursor, i.e., lacking the back side flood irradiation step described herein, produces a thin film having a relatively low degree of texture.

Thus, it has been discovered that differences in the degree of the texture between the base and the top of the film (pre-SLS) has a dramatic effect on the quality and degree of the texture in the final SLS-processed film. The methods and processes developed herein address this problem by creating a uniform degree of texture prior to performing SLS.

Back Side SLS

The irradiation on the back side of the thin film also can be SLS irradiation. Because laterally grown grain adopts the orientation of the seed, by selecting seed crystals of similar crystallographic orientation (texture), it is possible to grow large location-controlled (microstructure) grains of similar crystallographic orientation. The embodiments of the disclosed subject matter are directed to particular combinations of a texture-developing technology and the SLS process, discussed in detail above.

Figure 1B:
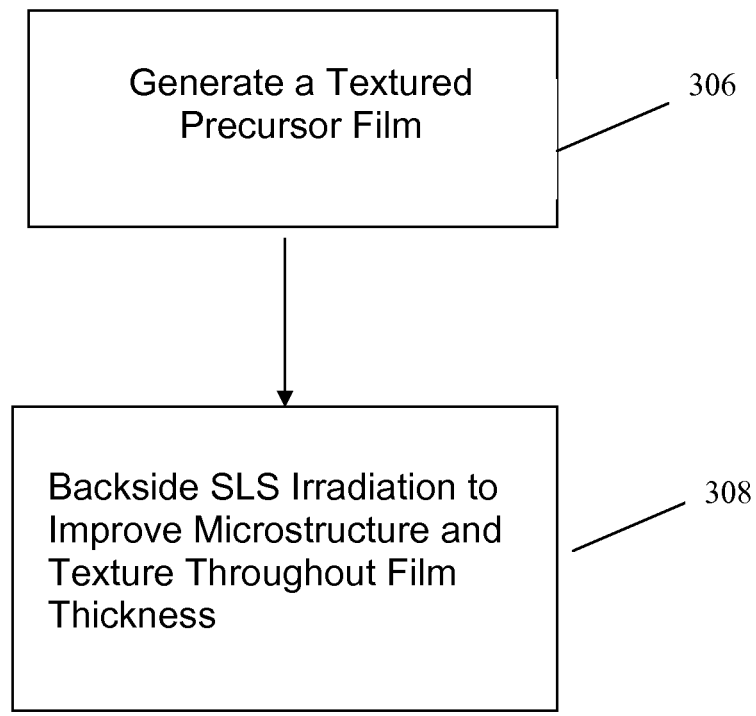
FIG. 1B is an illustrative schematic of another back side laser irradiation method in accordance with one or more embodiments described herein.
Figure 3:
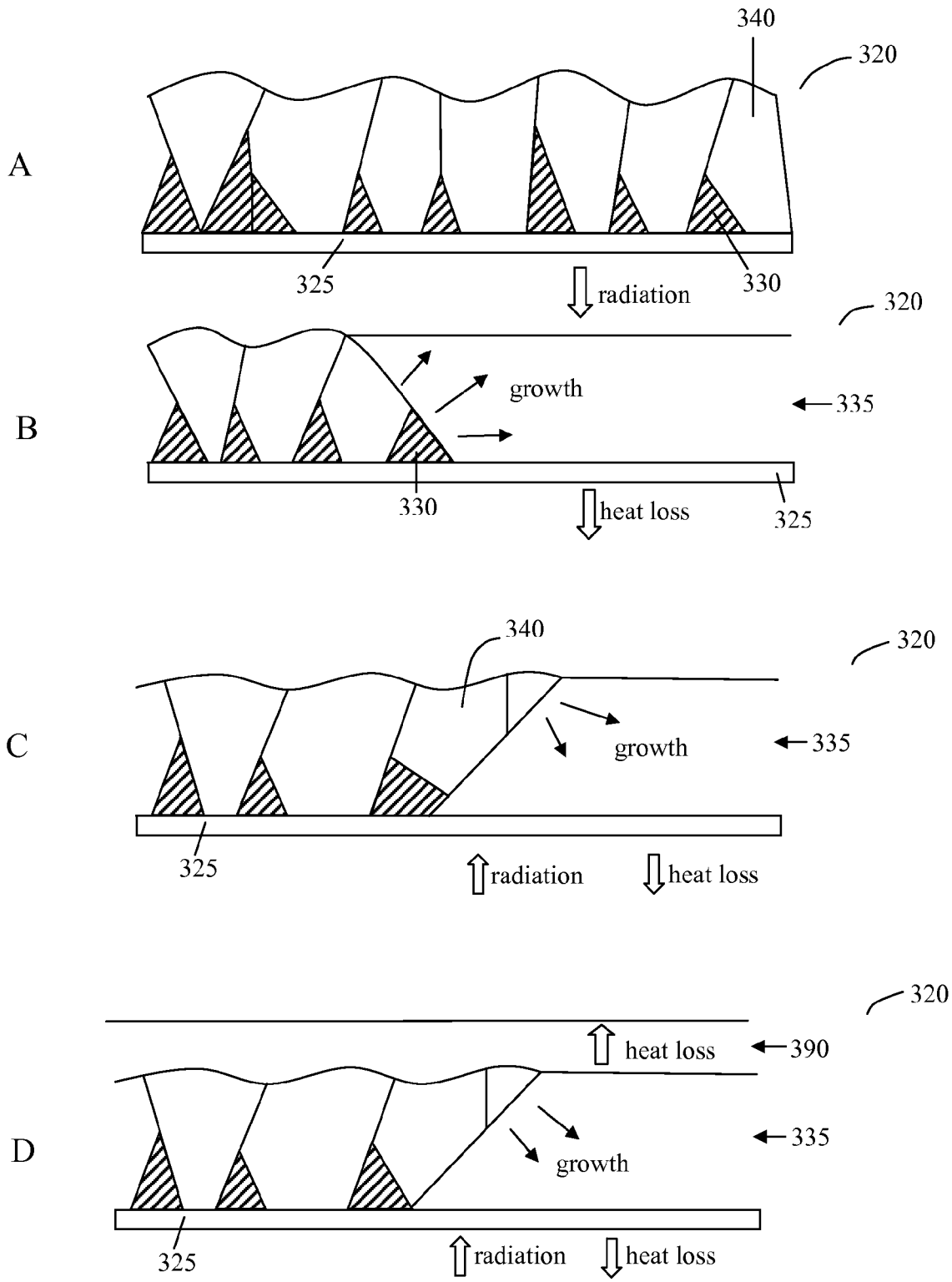
FIG. 3A is an illustrative schematic of a conventional textured film.
FIG. 3B is an illustrative schematic of top side laser irradiation processes in accordance with the prior art.
FIGS. 3C-D are illustrative schematics of back side laser irradiation processes in accordance with one or more embodiments described herein.

As shown in FIG. 1B, the method includes (1) providing a textured precursor film (306) and (2) back side SLS irradiation to improve microstructure and texture throughout the film thickness (308). The textured film 320, as shown in FIG. 3A, is provided according to the embodiments disclosed above. Note that there are regions of low texture, 330 near the bottom of the textured film, towards the substrate 325, and regions of high texture 340 near the top of the textured film 320. The back side SLS is performed in a similar manner as the front side SLS disclosed above and shown in FIG. 3B except that the SLS is performed through the substrate 325 on the back side of the film, 320 shown in FIG. 3C.

In this process, the reverse effect is observed as is disclosed in the prior art crystallization techniques. Recall the previous discussion that texture was poorer in samples that were top irradiated, because lateral growth was seeded by grains located at or near the bottom interface of the film, as shown in FIG. 3B (where the radiation from the front side of the thin film favors the lateral growth of poorly textured crystals 330 due to more rapid cooling at the substrate interface because of heat loss through the substrate 325). By irradiating from the back side of the film 320, the opposite occurs. Initially, the irradiation creates a heat gradient in which the melted silicon 335 is hotter at the interface with the substrate because it is closest to the laser. Therefore, crystallization will be initiated at the cooler surface of the film layer, as is shown in FIG. 2. When the laser shuts off, the substrate acts as a heat sink and quickly draws the heat away from the melted silicon 335 adjacent to the substrate. However, lateral growth has already set in before this happens and thus the texture of the crystallization is dominated by the top part of the film 340. As shown in FIG. 3D, a capping layer 390, may further assist in maintaining the integrity of the film 320 as well as offering a heat sink at the top to maintain for a longer period of time the reversed temperature gradient, if needed.

While there have been shown and described examples of the disclosed subject matter, it will be readily apparent to those skilled in the art that various changes and modifications may be readily apparent to those skilled in the art that various changes and modifications may be made therein without departing from the scope of the disclosed subject matter as defined by the appended claims. Accordingly, the disclosed subject matter is limited only by the following claims and equivalents thereto.

What is claimed is:

1. A system for processing a textured film on a transparent substrate, comprising:
    at least one laser for generating a plurality of laser beam pulses;
    a film support for positioning the textured film and the transparent substrate, the film support being capable of movement in at least one direction, and at least a portion of said film support transparent to laser irradiation;
    optics for directing a first set of laser beam pulses through a first mask and through the transparent portion of the film support and the transparent substrate to irradiate the textured film from the back side of the film to generate a film having a uniform high degree of texture throughout the thickness of the film; and
    a controller for controlling the movement of the film support in conjunction with frequency of the first set of and second set of laser beam pulses.

2. The system of claim 1 comprising a mask support.

3. The system of claim 1, wherein the textured film is generated by direct deposition methods.

4. The system of claim 3, wherein the direct deposition methods comprise one of chemical vapor deposition, sputtering, and evaporation.

5. The system of claim 1, wherein the pulsed laser crystallization methods comprise one of sequential lateral solidification and multiple-pulse excimer laser annealing processes.

6. A system for processing a film on a substrate comprising:
    a substrate, wherein at least a portion of the this substrate is transparent to laser irradiation;
    a precursor film on a substrate comprising crystal grains having a non-uniform degree of texture throughout the thickness of the film; and
    means for irradiating the textured precursor film from the back side of the film using a pulsed laser crystallization technique to re-orient the crystal grains to create a thin film having a uniform high degree of texture throughout the thin film.

7. The system of claim 6, wherein said pulsed laser crystallization technique comprises flood irradiation wherein the crystal grains having a crystallographic orientation predominantly in one direction are not completely melted.

8. The system of claim 6, wherein said pulsed laser crystallization technique comprises sequential lateral solidification wherein a portion of the crystal grains having a crystallographic orientation predominantly in one direction are completely melted and the melted portion laterally crystallizes on said crystallographically oriented crystals.

* * * * *